United States Patent [19]

Chin

[11] Patent Number: 5,494,848

[45] Date of Patent: Feb. 27, 1996

[54] BURIED CONTACT TRENCH PROCESS

[75] Inventor: Hsien W. Chin, Hsin Chu, Taiwan

[73] Assignee: Taiwan Semiconductor Manufacturing Co., Hsinchu, Taiwan

[21] Appl. No.: 405,719

[22] Filed: Mar. 17, 1995

[51] Int. Cl.$^6$ .................................................. H01L 21/44
[52] U.S. Cl. .............................................. 437/191; 437/924
[58] Field of Search ..................................... 437/191, 165, 437/162, 46, 186, 924; 148/DIG. 102

[56] References Cited

U.S. PATENT DOCUMENTS

| | | | |
|---|---|---|---|
| 5,063,172 | 11/1991 | Manlex | 437/195 |
| 5,272,099 | 12/1993 | Chou et al. | 437/162 |
| 5,350,712 | 9/1994 | Shibata | 437/195 |

*Primary Examiner*—George Fourson
*Assistant Examiner*—Thomas G. Bilodeau
*Attorney, Agent, or Firm*—George O. Saile; Rosemary L. S. Pike

[57] ABSTRACT

A new method of forming improved buried contact junctions is described. A layer of gate silicon oxide and a first polysilicon layer are provided overlying the surface of a semiconductor substrate. The first polysilicon and gate silicon oxide layers are etched away where they are not covered by a buried contact mask to provide an opening to the semiconductor substrate. A second layer of polysilicon is deposited over the first polysilicon layer and within the opening. The second polysilicon layer is doped with dopant which is driven in to form a buried contact junction within the semiconductor substrate under the opening. A layer of silicon oxide is deposited overlying the second polysilicon layer. The oxide and second polysilicon layers are patterned to form a polysilicon contact overlying the buried contact junction wherein the mask used for the patterning is misaligned and wherein a portion of the buried contact junction is exposed and wherein a portion of the first polysilicon layer remains as residue. A photoresist mask is formed covering the polysilicon contact and extending on either side of the polysilicon contact so that the exposed portion of the buried contact junction is covered by the photoresist mask. The first polysilicon layer residue is etched away wherein the photoresist mask protects the exposed portion of the buried contact junction from the etching completing the formation of a buried contact in the fabrication of an integrated circuit.

29 Claims, 4 Drawing Sheets

BURIED CONTACT TRENCH PROCESS

BACKGROUND OF THE INVENTION (1) Field of the Invention

The invention relates to the fabrication of integrated circuit devices, and more particularly, to a method of an improved buried contact trench in the fabrication of integrated circuits.

(2) Description of the Prior Art

A typical buried contact is formed by depositing a doped layer of polysilicon over and on the planned buried contact regions and heating the structure. The buried contact regions are doped by outdiffusion of dopants from the doped polysilicon layer into the silicon substrate. The doped polysilicon layer is allowed to remain on the buried contact regions as their contacts. If there is misalignment of the mask during etching of the polysilicon, a portion of the semiconductor substrate within the buried contact area will be exposed. During polysilicon overetching, a buried contact trench will be etched. The buried contact is formed to connect the polysilicon and the substrate. If the buried contact trench is so deep as to be a barrier to the current flow from the polysilicon to the substrate, or the reverse, the integrated circuit will not function correctly.

U.S. Pat. No. 5,350,712 to Shibata teaches the use of an additional metal width around a metal line to overcome mask misalignment problems causing etching of the semiconductor substrate.

SUMMARY OF THE INVENTION

A principal object of the present invention is to provide an effective and very manufacturable method of forming buried contact junctions with an improved buried contact trench.

Another object of the present invention is to provide a method of forming buried contact junctions which will not be harmed by mask misalignment.

In accordance with the objects of this invention a new method of forming improved buried contact junctions is achieved. A layer of gate silicon oxide is provided overlying the surface of a semiconductor substrate. A first polysilicon layer is deposited overlying the gate silicon oxide layer. The first polysilicon and gate silicon oxide layers are etched away where they are not covered by a buried contact mask to provide an opening to the semiconductor substrate. A second layer of polysilicon is deposited over the first polysilicon layer and over the semiconductor substrate within the opening. The second polysilicon layer is doped with dopant which is driven in to form a buried contact junction within the semiconductor substrate under the opening. A layer of silicon oxide is deposited overlying the second polysilicon layer. The oxide and second polysilicon layers are patterned to form a polysilicon contact overlying the buried contact junction wherein the mask used for the patterning is misaligned and wherein a portion of the buried contact within the semiconductor substrate is exposed and wherein a portion of the first polysilicon layer remains as residue. A photoresist mask is formed covering the polysilicon contact and extending on either side of the polysilicon contact so that the exposed portion of the buried contact junction within the semiconductor substrate is covered by the photoresist mask. The first polysilicon layer residue is etched away wherein the photoresist mask protects the exposed portion of the buried contact junction within the semiconductor substrate from the etching completing the formation of a buried contact in the fabrication of an integrated circuit.

BRIEF DESCRIPTION OF THE DRAWINGS

In the accompanying drawings forming a material part of this description, there is shown.

DESCRIPTION OF THE PREFERRED EMBODIMENTS

Figure 1:
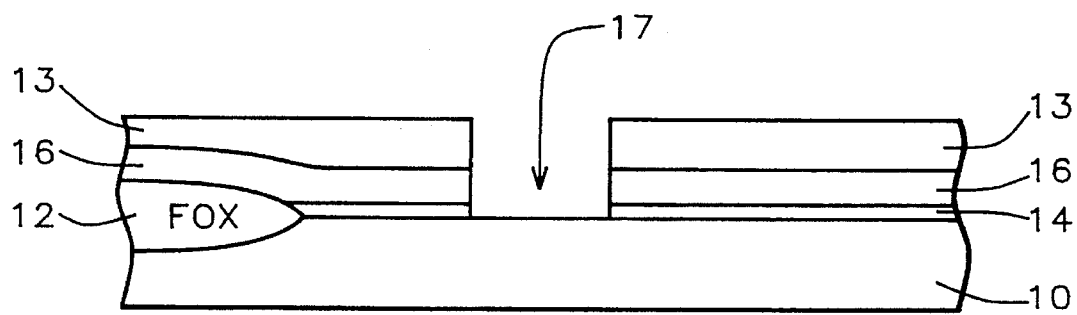
FIGS. 1 through 6, 7B and 8 schematically illustrate in cross-sectional representation a preferred embodiment of the process of the present invention.

Referring now more particularly to FIG. 1, there is shown a portion of a partially completed integrated circuit. There is shown a monocrystalline semiconductor substrate 10 in which there are formed field oxide regions 12. A gate oxide layer 14 is grown on the surface of the semiconductor substrate, typically to a thickness of between about 80 to 140 Angstroms. The polysilicon layer 16 is blanket deposited by low pressure chemical vapor deposition (LPCVD) at a temperature of between about 600° to 650° C. to a thickness of between about 500 to 600 Angstroms.

A buried contact mask is used to make a photoresist mask 13 overlying the polysilicon layer 16. The polysilicon and gate oxide layers are etched away where they are not covered by the mask to form the buried contact opening 17. While a single thick polysilicon layer is an acceptable alternative, a split polysilicon process is preferred and will be described herein.

Figure 2:
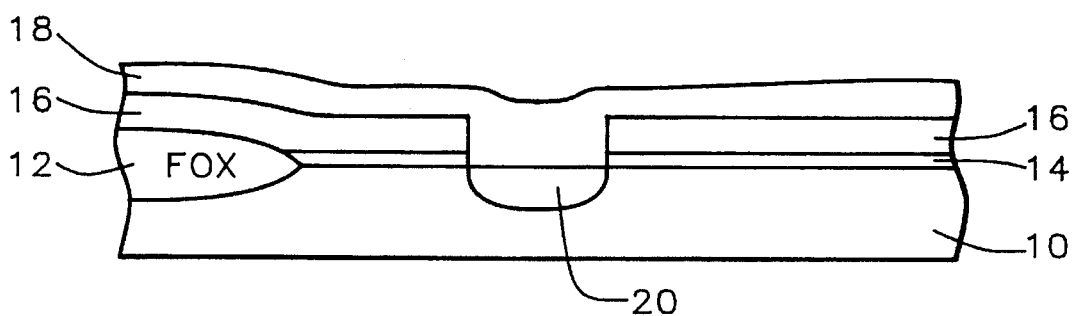

Referring now to FIG. 2, a second layer of polysilicon 18 is deposited by LPCVD to a thickness of between about 2000 to 5000 Angstroms. The buried contact is formed either by diffusion or by ion implanting the top polysilicon layer 18. For diffusion, a $POCl_3$ process is used at a high temperature of between about 850° to 950° C. For ion implantation, phosphorus or arsenic ions are implanted to produce N+ regions or boron or $BF_2$ ions are implanted to produce P+ regions. Preferred dosages are in the range of between about 1 E 15 to 5 E 15 atoms/$cm^3$. Alternatively, the polysilicon layer 18 could be in-situ doped.

The dopants are driven into the silicon substrate at a temperature of between about 850° to 950° C. to form buried junction 20. This is done as part of the $POCl_3$ process or during post-etching annealing.

Figure 3:
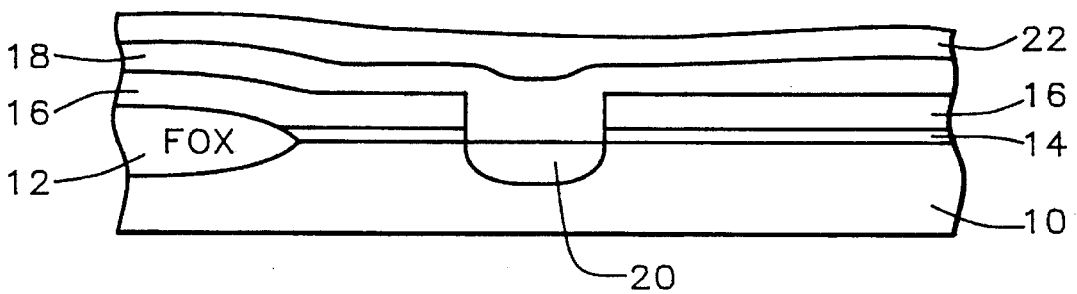

Referring now to FIG. 3, a layer of silicon oxide 22 is deposited by chemical vapor deposition to a thickness of between about 2000 to 5000 Angstroms over the surface of the second polysilicon layer 18.

Figure 4:
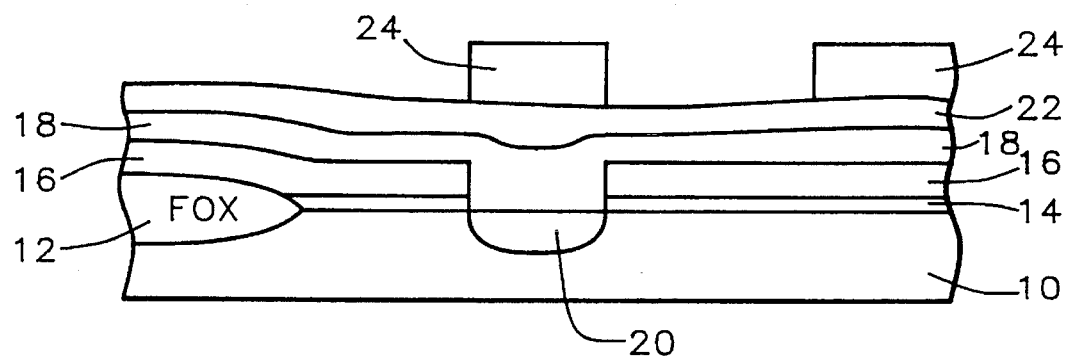
Figure 5:
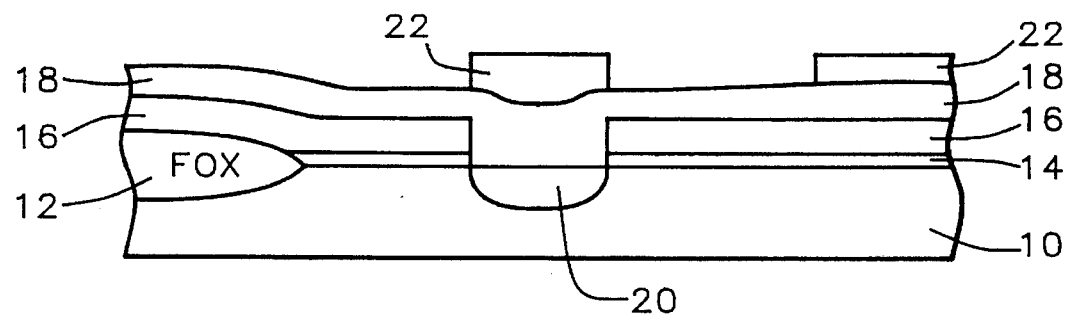

Next, a layer of photoresist is coated over the silicon oxide layer 22 and patterned to form a photoresist mask 24, shown in FIG. 4. The silicon oxide layer 22 is etched away where it is not covered by photoresist mask 24. The photoresist is removed, resulting in FIG. 5.

Figure 6:
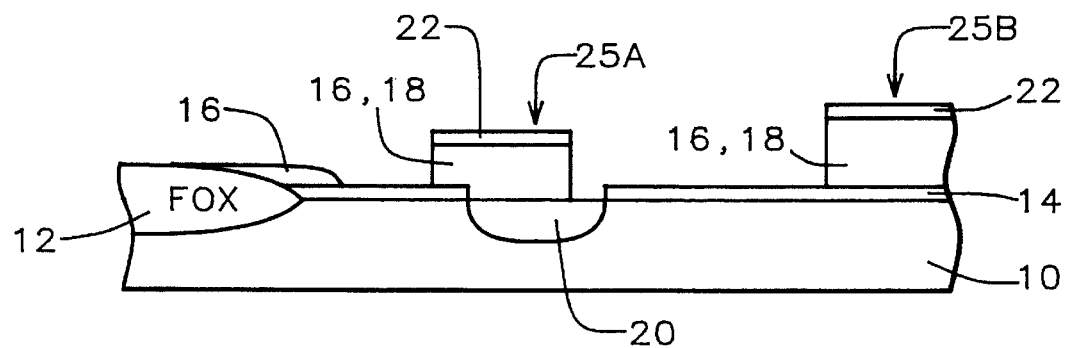

The main polysilicon etch, the results of which are illustrated in FIG. 6, is typically a plasma etch or a reactive ion etching with an etch stop at the gate silicon oxide layer 14. In FIGS. 6 through 9, the two polysilicon layers 16 and 18 have been combined into polysilicon layer 16, 18. Also, in these figures, the photomask has been slightly misaligned so that the polysilicon contact 25A is not directly over the buried junction 20, but is slightly overlying the gate oxide layer 14 at one side so that a portion of the semiconductor substrate containing the buried junction is exposed at the opposite side. A portion of the first polysilicon layer 16 over the FOX 12 remains as residue after the main etching. This must be removed in an-overetching step.

Figure 7A:
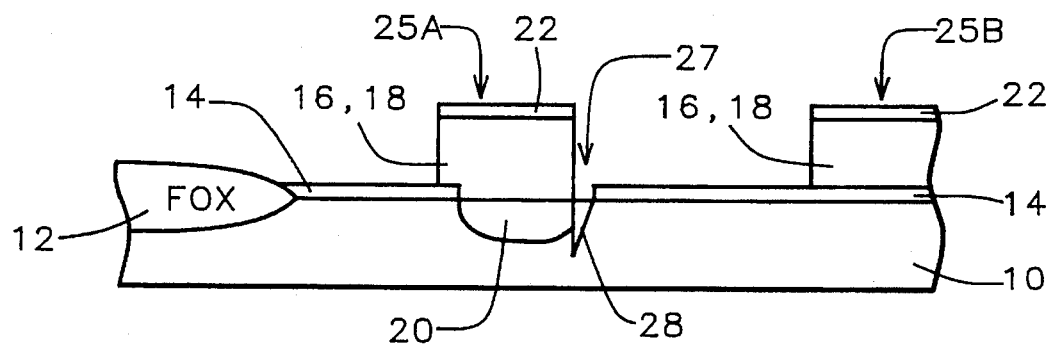
FIG. 7A schematically illustrates in cross-sectional representation an embodiment of the prior art.

Referring now to FIG. 7A, the overetch to remove the polysilicon residue 16 will result in the etching of a buried contact trench 28 into the semiconductor substrate. Because of the photomask misalignment, the oxide layer 22 on top of the polysilicon contact 25A does not protect the area 27 which is also beyond the protection of the gate silicon oxide 14. The buried contact trench 28 at the buried contact junction 20 will be a barrier between the junction formed by the buried contact and the junction formed by the source/drain implant. This will prevent the current flow between the polysilicon contact and the substrate.

Figure 7B:
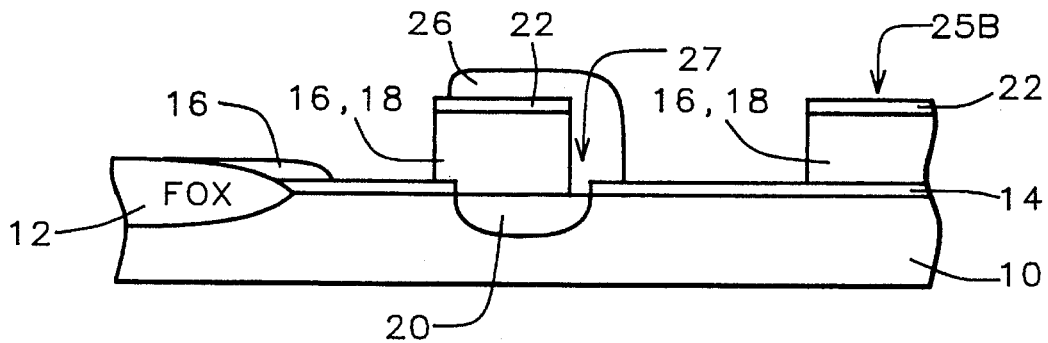
Figure 8:
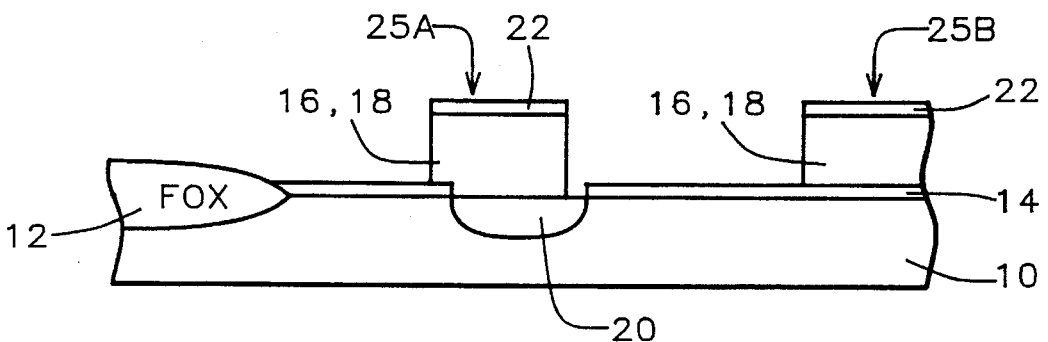

However, as illustrated in FIG. 7B, in the process of the present invention, a layer of photoresist is coated over the surface of the substrate. An inverse tone of the buried contact mask is used to make a photoresist mask 26 covering the buried junction area. A 0.2 µm bias is added to each side of the photoresist mask to cover the misalignment of the photolithography process. A 0.2 µm bias is enough for current process control. An additional amount could be added if necessary. The additional size of the mask 26 covers the vulnerable area 27 of the semiconductor substrate. The overetching removes the polysilicon residue 16. The area 27 exposed by mask misalignment, but covered by the mask 26, is protected from being etched. The photoresist is removed, resulting in FIG. 8. Polysilicon gate 25B and polysilicon contact 25A have been completed. The misalignment of the polysilicon mask causes no damage to the buried contact junction.

Figure 9:
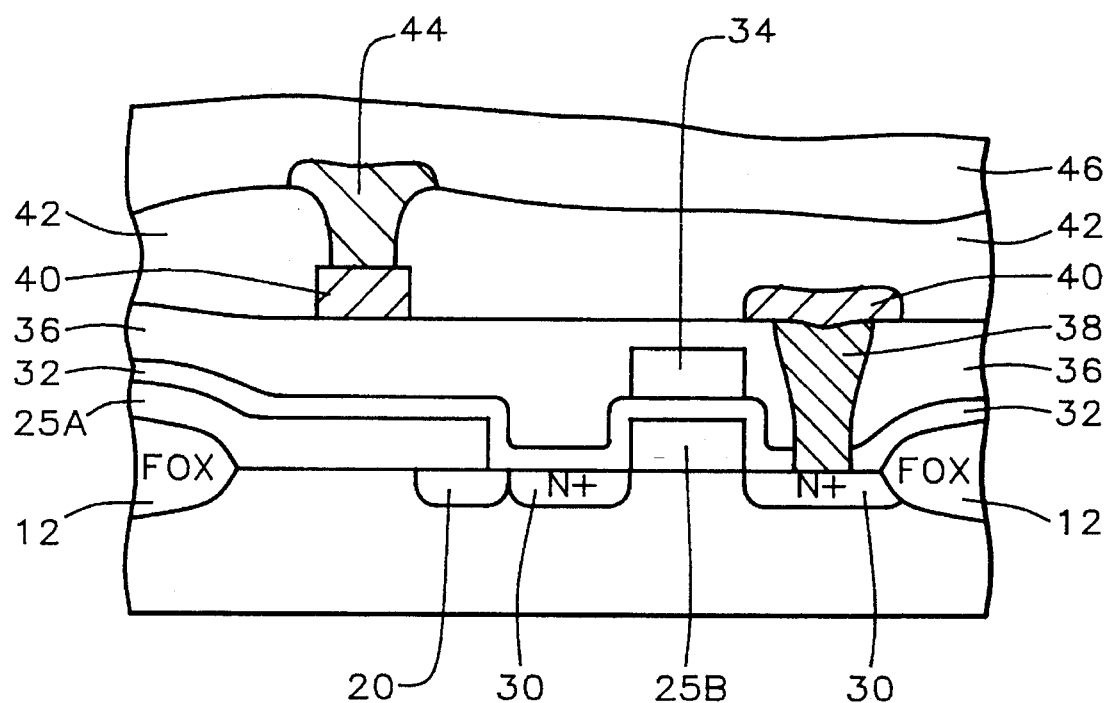
FIG. 9 schematically illustrates in cross-sectional representation a preferred embodiment of this invention for a static random access memory (SRAM).

Processing continues as is conventional in the art to form source and drain regions and to complete the integrated circuit device. This approach can be directly applied to static random access memory (SRAM) buried contacts or to any device utilizing a buried contact for connecting polysilicon and the semiconductor substrate. A SRAM is illustrated in FIG. 9. Elongated polysilicon contact 25A and gate 25B are shown. Buried contact 20 and source and drain regions 30, which may be N+ or P+, are shown within the semiconductor substrate. The first polysilicon contact 25A and gate 25B have been covered with an interpoly oxide 32 and a second polysilicon layer 34 has been patterned and covered by an interlevel dielectric 36. A contact opening has been made to source/drain region 30 and filled with, for example, a tungsten plug 38 and aluminum metallurgy 40. Intermetal dielectric layer 42 and second level metallurgy 44 are covered by passivation layer 46 to complete the fabrication of the integrated circuit.

While the invention has been particularly shown and described with reference to the preferred embodiments thereof, it will be understood by those skilled in the art that various changes in form and details may be made without departing from the spirit and scope of the invention.

What is claimed is:

1. A method of forming a buried contact in a semiconductor substrate in the fabrication of an integrated circuit comprising:

providing a layer of gate silicon oxide over the surface of said semiconductor substrate;

depositing a first polysilicon layer overlying said gate silicon oxide layer;

etching away said first polysilicon and said gate silicon oxide layers where they are not covered by a buried contact mask to provide an opening to said semiconductor substrate;

depositing a second layer of polysilicon over said first polysilicon layer and over said semiconductor substrate within said opening;

doping said second polysilicon layer with dopant;

driving in said dopant to form a buried contact junction within said semiconductor substrate under said opening;

depositing a second layer of silicon oxide overlying said second polysilicon layer;

patterning said second oxide and said first and second polysilicon layers to form a polysilicon contact overlying said buried contact junction wherein a portion of said buried contact within said semiconductor substrate is exposed and wherein a portion of said first polysilicon layer other than that of the contact remains as residue;

forming a photoresist mask covering said polysilicon contact and extending on either side of said polysilicon contact so that the exposed portion of said buried contact junction within said semiconductor substrate is covered by said photoresist mask; and etching away said first polysilicon layer residue wherein said photoresist mask protects said exposed portion of said buried contact junction within said semiconductor substrate from said etching completing the formation of said buried contact in the fabrication of an integrated circuit.

2. The method according to claim 1 wherein said first polysilicon layer has a thickness of between about 500 to 600 Angstroms.

3. The method according to claim 1 wherein said second polysilicon layer has a thickness of between about 2000 to 5000 Angstroms.

4. The method according to claim 1 wherein said second polysilicon layer is doped by diffusion of $POCl_3$.

5. The method according to claim 1 wherein said second polysilicon layer is doped by ion implant of phosphorus ions with a dosage of between about 1 E 15 to 5 E 15 atoms/cm$^3$.

6. The method according to claim 1 wherein said second polysilicon layer is doped by ion implant of arsenic ions with a dosage of between about 1 E 15 to 5 E 15 atoms/cm$^3$.

7. The method according to claim 1 wherein said second polysilicon layer is doped by ion implant of boron ions with a dosage of between about 1 E 15 to 5 E 15 atoms/cm$^3$.

8. The method according to claim 1 wherein said second polysilicon layer is doped by ion implant of $BF_2$ ions with a dosage of between about 1 E 15 to 5 E 15 atoms/cm$^3$.

9. The method according to claim 1 wherein said drive-in of said buried contact is performed at between about 850° to 950° C.

10. The method according to claim 1 wherein said second silicon oxide layer is deposited to a thickness of between about 2000 to 5000 Angstroms.

11. The method according to claim 1 wherein said photoresist mask is formed using an inverse tone of said buried contact mask wherein said photoresist is patterned to be wider than said polysilicon contact.

12. The method according to claim 11 wherein said photoresist is patterned to be about 0.2 micrometers wider than said polysilicon contact on either side.

13. A method of forming a buried contact in a semiconductor substrate in the fabrication of a static random access memory (SRAM) integrated circuit comprising:

providing a layer of gate silicon oxide over the surface of said semiconductor substrate;

depositing a first polysilicon layer overlying said gate silicon oxide layer;

etching away said first polysilicon and said gate silicon oxide layers where they are not covered by a buried contact mask to provide an opening to said semiconductor substrate;

depositing a second layer of polysilicon over said first polysilicon layer and over said semiconductor substrate within said opening;

doping said second polysilicon layer with dopant;

driving in said dopant to form a buried contact junction within said semiconductor substrate under said opening;

depositing a second layer of silicon oxide overlying said second polysilicon layer;

patterning said second oxide and said first and second polysilicon layers to form a polysilicon contact overlying said buried contact junction wherein a portion of said buried contact within said semiconductor substrate is exposed and wherein a portion of said first polysilicon layer other than that of the contact remains as residue;

forming a photoresist mask covering said polysilicon contact and extending on either side of said polysilicon contact so that the exposed portion of said buried contact junction within said semiconductor substrate is covered by said photoresist mask; and etching away said first polysilicon layer residue wherein said photoresist mask protects said exposed portion of said buried contact junction within said semiconductor substrate from said etching completing the formation of said buried contact in the fabrication of said SRAM integrated circuit.

14. The method according to claim 13 wherein said first polysilicon layer has a thickness of between about 500 to 600 Angstroms.

15. The method according to claim 13 wherein said second polysilicon layer has a thickness of between about 2000 to 5000 Angstroms.

16. The method according to claim 13 wherein said second polysilicon layer is doped by diffusion of $POCl_3$.

17. The method according to claim 13 wherein said second polysilicon layer is doped by ion iplant of phosphorus ions with a dosage of between about 1 E 15 to 5 E 15 atoms/$cm^3$.

18. The method according to claim 13 wherein said second polysilicon layer is doped by ion implant of arsenic ions with a dosage of between about 1 E 15 to 5 E 15 atoms/$cm^3$.

19. The method according to claim 13 wherein said second polysilicon layer is doped by ion implant of boron ions with a dosage of between about 1 E 15 to 5 E 15 atoms/$cm^3$.

20. The method according to claim 13 wherein said second polysilicon layer is doped by ion implant of $BF_2$ ions with a dosage of between about 1 E 15 to 5 E 15 atoms/$cm^3$.

21. The method according to claim 13 wherein said drive-in of said buried contact is performed at between about 850° to 950° C.

22. The method according to claim 13 wherein said second silicon oxide layer is deposited to a thickness of between about 2000 to 5000 Angstroms.

23. The method according to claim 13 wherein said photoresist mask is formed using an inverse tone of said buried contact mask wherein said photoresist is patterned to be wider than said poysilicon contact.

24. The method according to claim 23 wherein said photoresist is patterned to be about 0.2 micrometers wider than said polysilicon contact on either side.

25. A method of forming a buried contact in a semiconductor substrate in the fabrication of an integrated circuit comprising:

providing a layer of gate silicon oxide over the surface of said semiconductor substrate;

depositing a first polysilicon layer overlying said gate silicon oxide layer;

etching away said first polysilicon and said gate silicon oxide layers where they are not covered by a buried contact mask to provide an opening to said semiconductor substrate;

depositing a second layer of polysilicon over said first polysilicon layer and over said semiconductor substrate within said opening;

doping said second polysilicon layer with dopant;

driving in said dopant to form a buried contact junction within said semiconductor substrate under said opening;

depositing a second layer of silicon oxide overlying said second polysilicon layer;

patterning said second oxide and said first and second polysilicon layers to form a polysilicon contact overlying said buried contact junction wherein a portion of said buried contact within said semiconductor substrate is exposed and wherein a portion of said first polysilicon layer other than that of the contact remains as residue;

forming a photoresist mask covering said polysilicon contact wherein said photoresist mask is formed by using an inverse tone of said buried contact mask wherein said photoresist is patterned to be wider than said polysilicon contact so that the exposed portion of said buried contact junction within said semiconductor substrate is covered by said photoresist mask; and etching away said first polysilicon layer residue wherein said photoresist mask protects said exposed portion of said buried contact junction within said semiconductor substrate from said etching completing the formation of said buried contact in the fabrication of an integrated circuit.

26. The method according to claim 25 wherein said photoresist is patterned to be about 0.2 micrometers wider than said polysilicon contact on either side.

27. A method of forming a buried contact in a semiconductor substrate in the fabrication of an integrated circuit comprising:

providing a layer of gate silicon oxide over the surface of said semiconductor substrate;

depositing a first polysilicon layer overlying said gate silicon oxide layer;

etching away said first polysilicon and said gate silicon oxide layers where they are not covered by a buried contact mask to provide an opening to said semiconductor substrate;

depositing a second layer of polysilicon over said first polysilicon layer and over said semiconductor substrate within said opening;

doping said second polysilicon layer with dopant;

driving in said dopant to form a buried contact junction within said semiconductor substrate under said opening;

depositing a second layer of silicon oxide overlying said second polysilicon layer;

patterning said second oxide and said first and second polysilicon layers to form a polysilicon contact overlying said buried contact junction wherein a portion of said first polysilicon layer other than that of the contact remains as residue;

forming a photoresist mask covering said polysilicon contact and extending on either side of said polysilicon contact; and etching away said first polysilicon layer residue completing the formation of said buried contact in the fabrication of an integrated circuit.

28. The method according to claim 27 wherein said photoresist mask is formed using an inverse tone of said buried contact mask wherein said photoresist is patterned to be wider than said polysilicon contact.

29. The method according to claim 27 wherein said photoresist is patterned to be about 0.2 micrometers wider than said polysilicon contact on either side.

* * * * *